(12) United States Patent
Terashima

(10) Patent No.: US 7,598,587 B2
(45) Date of Patent: Oct. 6, 2009

(54) SEMICONDUCTOR DEVICE

(75) Inventor: Tomohide Terashima, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 153 days.

(21) Appl. No.: 11/047,609

(22) Filed: Feb. 2, 2005

(65) Prior Publication Data

US 2006/0043417 A1 Mar. 2, 2006

(30) Foreign Application Priority Data

Aug. 30, 2004 (JP) ............... 2004-250116

(51) Int. Cl.
 *H01L 29/93* (2006.01)
(52) U.S. Cl. ............... 257/494; 257/E29.012
(58) Field of Classification Search ........ 257/492, 257/E29.012
 See application file for complete search history.

(56) References Cited

U.S. PATENT DOCUMENTS

| 5,156,989 | A | * | 10/1992 | Williams et al. | ....... 438/206 |
| 6,424,014 | B2 | | 7/2002 | Sasaki et al. | |
| 2003/0173624 | A1 | * | 9/2003 | Choi et al. | ....... 257/368 |
| 2004/0084744 | A1 | | 5/2004 | Khemka et al. | |

FOREIGN PATENT DOCUMENTS

JP 2001-237437 8/2001
JP 2003-92414 3/2003

OTHER PUBLICATIONS

A.W. Ludikhuize et al., "Improved Device Ruggedness by Floating Buffer Ring", The 12th International Symposium on Power Semiconductor Devices & Ics, 2000, pp. 153-156.
Vishnu Khemka, "A Floating Resurf (Fresurf) LD-MOSFET Device Concept", IEEE Electron Device Letters, vol. 24, No. 10, Oct. 2003, pp. 664-666.

* cited by examiner

*Primary Examiner*—Bradley K Smith
*Assistant Examiner*—Amar Movva
(74) *Attorney, Agent, or Firm*—Buchanan Ingersoll & Rooney PC

(57) ABSTRACT

A semiconductor layer of n⁻ type is formed on a semiconductor substrate of p⁻ type. A first buried impurity region of n⁺ type is formed at an interface between the semiconductor substrate and the semiconductor layer. A second buried impurity region of p⁺ type is formed at an interface between the first buried impurity region and the semiconductor layer. Above the first and second buried impurity regions, a first impurity region of n type is formed in an upper surface of the semiconductor layer. Above the first and second buried impurity regions, a second impurity region of p type is also formed apart from the first impurity region in the upper surface of the semiconductor layer. When the second impurity region becomes higher in potential than the first impurity region, the second impurity region and the second buried impurity region are electrically isolated from each other by a depletion layer.

19 Claims, 13 Drawing Sheets

F I G . 1
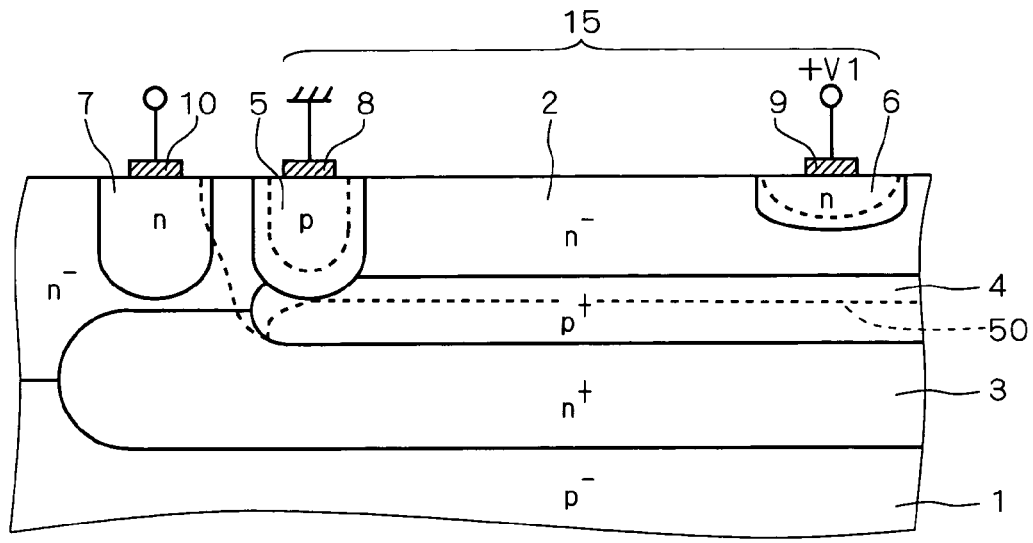
F I G . 2
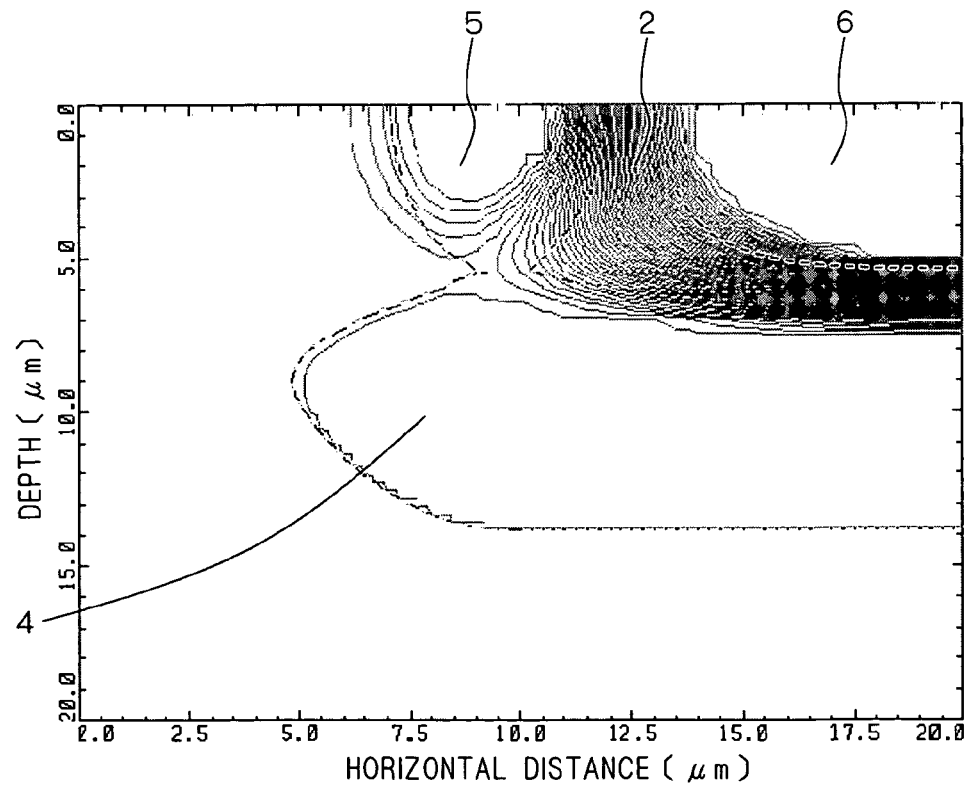

F I G . 7
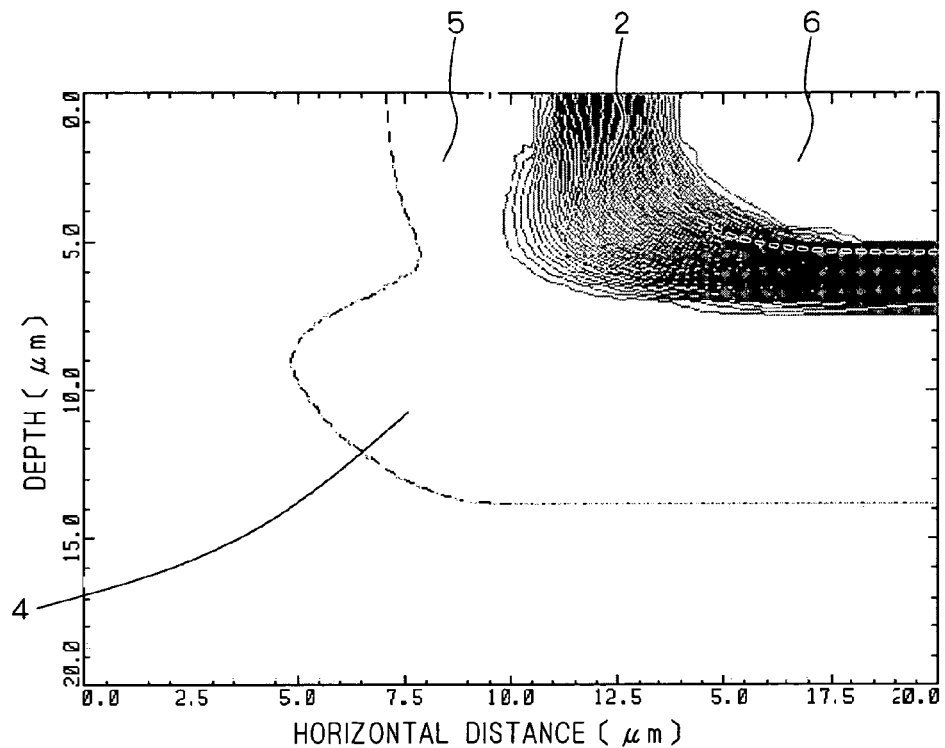
F I G . 8
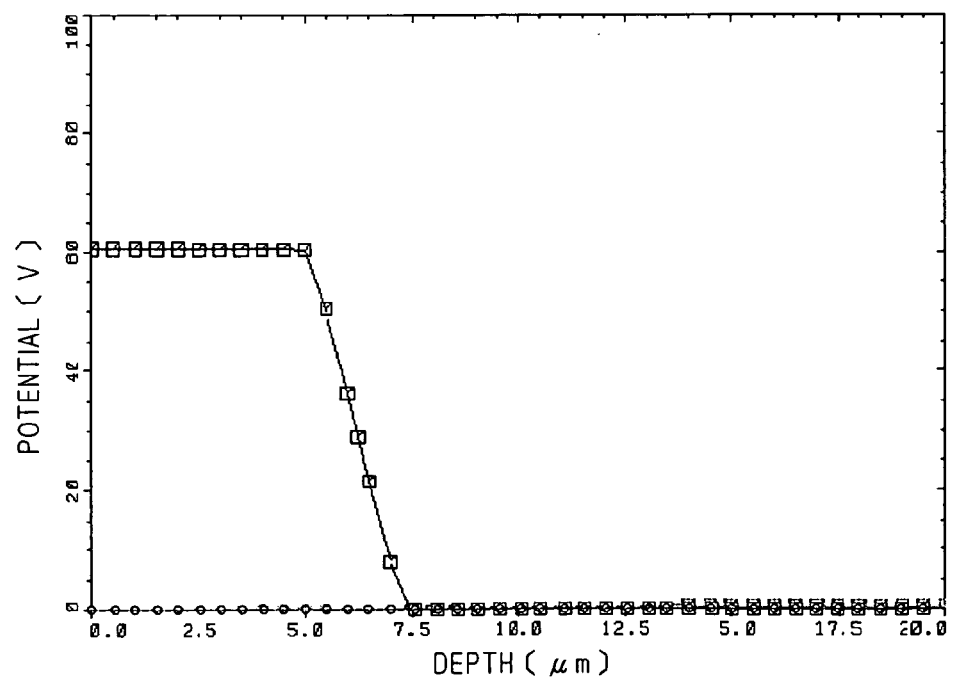

US 7,598,587 B2

SEMICONDUCTOR DEVICE

BACKGROUND OF THE INVENTION

1. Field of the Invention

This invention relates to techniques for increasing breakdown voltage of a semiconductor device.

2. Description of the Background Art

Various types of techniques for increasing breakdown voltage of a semiconductor device have been conventionally proposed. For example, a technique for increasing breakdown voltage of a diode element is proposed by a publication entitled "Improved device ruggedness by floating buffer ring," The 12th International Symposium on Power Semiconductor Devices & Ics, 2000, pp. 153 to 156, by A. W. Ludikhuize, et al. (hereinafter referred to as "Ludikhuize document"). Also, techniques for increasing breakdown voltage of a semiconductor device are disclosed in Japanese Patent Application Laid-Open Nos. 2003-092414 and 2001-237437.

In the semiconductor device described in the Ludikhuize document, a breakdown voltage in a thickness direction was not always ensured to a sufficient degree.

SUMMARY OF THE INVENTION

It is an object of this invention to provide techniques capable of increasing breakdown voltage in a thickness direction of a semiconductor device.

In an aspect of this invention, a semiconductor device includes: a semiconductor substrate of p type; a semiconductor layer of n type; a first buried impurity region of n type; a second buried impurity region of p type; a first impurity region of n type; and a second impurity region of p type. The semiconductor layer is provided on the semiconductor substrate. The first buried impurity region is provided at an interface between the semiconductor substrate and the semiconductor layer. The second buried impurity region is provided at an interface between the semiconductor layer and the first buried impurity region. The first impurity region is provided in an upper surface of the semiconductor layer above the second buried impurity region. The second impurity region is provided apart from the first impurity region in the upper surface of the semiconductor layer above the first buried impurity region. Upon applying a higher potential to the first impurity region than to the second impurity region, the second impurity region and the second buried impurity region are electrically isolated from each other by a depletion layer.

Upon applying a higher potential to the first impurity region than to the second impurity region, the second impurity region and the second buried impurity region are electrically isolated from each other by a depletion layer, rendering the second buried impurity region floating in potential. Accordingly, the potential of the second buried impurity region will be influenced by the potential of the first impurity region, and increased higher than the potential of the second impurity region. This reduces a potential difference between the first impurity region and the second buried impurity region directly thereunder further than when the second buried impurity region and the second impurity region are electrically connected and equal in potential to each other. Therefore, the breakdown voltage in a thickness direction directly under the first impurity region is increased.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a partial cross-sectional view of the structure of a semiconductor device according to a first preferred embodiment of this invention;

FIGS. 2 to 5 show simulation results regarding the operation of the semiconductor device according to the first preferred embodiment;

FIGS. 7 to 10 show simulation results regarding the operation of the device under comparison;

DESCRIPTION OF THE PREFERRED EMBODIMENTS

First Preferred Embodiment

Figure 3:
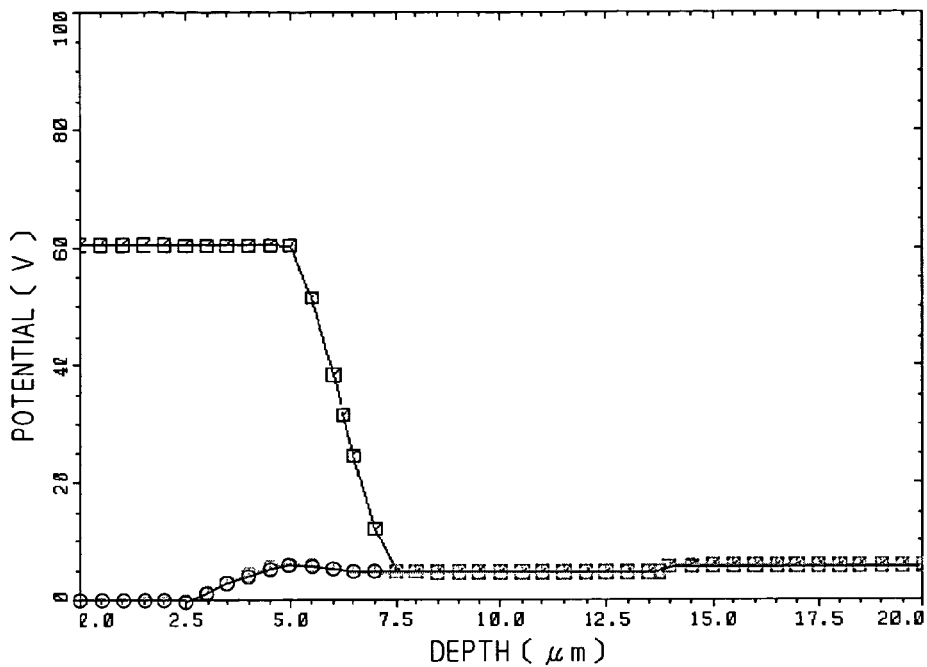

FIG. 1 shows a partial cross-sectional view of the structure of a semiconductor device according to a first preferred embodiment of this invention. This semiconductor device includes a diode element 15, and utilizes a RESURF (REduced SURface Field) effect to achieve a high breakdown voltage. As shown in FIG. 1, this semiconductor device includes a semiconductor substrate 1 of $p^-$ type. The semiconductor substrate 1 is a silicon substrate, for example, and has a semiconductor layer 2 that is an epitaxial layer of $n^-$ type formed thereon. A buried impurity region 3 of $n^+$ type is formed at an interface between the semiconductor substrate 1 and the semiconductor layer 2, and a buried impurity region 4 of $p^+$ type is formed at an interface between the buried impurity region 3 and the semiconductor layer 2.

The buried impurity regions 3 and 4 are both nearly circular in top view, with their centers nearly coinciding with each other. The radius of the buried impurity region 3 is greater than that of the buried impurity region 4. Thus in cross-sectional view, the end of the buried impurity region 3 in a lateral direction extends outward farther than that of the buried impurity region 4, as shown in FIG. 1.

Above the buried impurity regions 3 and 4, an impurity region 6 of n type is formed in an upper surface of the semiconductor layer 2, and a cathode electrode 9 of the diode element 15 is formed thereon. The impurity region 6 is provided almost above the centers of the nearly circular buried impurity regions 3 and 4, and is nearly circular in top view.

In the upper surface of the semiconductor layer 2 above the buried impurity regions 3 and 4, an impurity region 5 of p type is formed apart from the impurity region 6, and an anode electrode 8 of the diode element 15 is formed thereon. The impurity region 5 reaches the buried impurity region 4, and is formed along the outer edge of the buried impurity region 4 to center and surround the impurity region 6 in top view. The impurity region 5 is thus nearly annular in top view.

In the upper surface of the semiconductor layer 2, on the side opposite to the impurity region 6 with reference to the impurity region 5, an impurity region 7 of n type is formed apart from the impurity region 5. The impurity region 7 is formed above the outer edge of the buried impurity region 3 that is not in contact with the buried impurity region 4, to almost the same depth as the impurity region 5, and does not reach the buried impurity region 3. The impurity region 7 is also formed along the outer edge of the buried impurity region 3 to, together with the impurity region 5, center and surround the impurity region 6 in top view. Thus, the impurity region 7 too is nearly annular in top view. An electrode 10 is formed on the impurity region 7, which is insulated from the surroundings other than the impurity region 7. Accordingly, the impurity region 7 is floating in potential.

Upon applying a reverse voltage to the diode element 15 by applying a ground potential to the anode electrode 8 and a positive potential of several tens of volts to the cathode electrode 9 in the semiconductor device having the structure described above, the impurity region 6 becomes higher in potential than the impurity region 5 and the buried impurity region 4 connected thereto, causing a depletion layer to extend from the impurity region 5 and the buried impurity region 4. The depletion layer is then formed by the RESURF effect in almost the whole area of the semiconductor layer 2 surrounded by the impurity region 5 and the buried impurity region 4. Consequently, the electric field concentration near the upper surface of the semiconductor layer 2 is relieved, thereby achieving a high breakdown voltage of the semiconductor device.

Further in this semiconductor device, when the impurity region 6 becomes higher in potential than the impurity region 5 upon application of a reverse voltage to the diode element 15, the impurity region 5 and the buried impurity region 4 are electrically isolated from each other by the depletion layer.

In FIG. 1, broken lines 50 indicate the margins of the depletion layer upon application of a reverse voltage to the diode element 15, only in characteristic portions. This applies to broken lines 50 in FIGS. 6, 11, 12, and 17 to 22 as well, which will be discussed later. As can been seen from the shape formed by the broken lines 50, when the impurity region 6 becomes higher in potential than the impurity region 5, a depletion layer is formed from the bottom end of the impurity region 5 to the top end of the buried impurity region 4 in contact therewith, depleting the whole area of a contact portion of the impurity region 5 and the buried impurity region 4. Consequently, the impurity region 5 and the buried impurity region 4 are electrically isolated from each other by the deple-tion layer. This would be achieved by properly adjusting the diffusion depth and the impurity concentration of the impurity region 5, and the impurity concentration of the buried impurity region 4.

In addition, upon applying a reverse voltage to the diode element 15, a depletion layer is also formed in almost the whole area of the semiconductor layer 2 sandwiched between the impurity regions 5 and 7. This depletion layer, the depletion layer formed in the contact portion of the impurity region 5 and the buried impurity region 4, and the depletion layer formed in the semiconductor layer 2 surrounded by the impurity region 5 and the buried impurity region 4, are continuous with one another.

In this manner, in the semiconductor device of the first preferred embodiment, when the impurity region 6 becomes higher in potential than the impurity region 5 upon application of a reverse voltage to the diode element 15, the impurity region 5 and the buried impurity region 4 are electrically isolated from each other by the depletion layer. Consequently, the potential of the buried impurity region 4 floats just like the impurity region 7 even with the impurity region 5 being applied with a ground potential and the like, and will be influenced by the potential of the impurity region 6 and increased higher than the potential of the impurity region 5. This reduces a potential difference between the impurity region 6 and the buried impurity region 4 directly thereunder further than when the buried impurity region 4 and the impurity region 5 are electrically connected and equal in potential to each other. Therefore, the breakdown voltage in a thickness direction of the semiconductor device directly under the impurity region 6 is increased.

Because the breakdown voltage in a lateral direction of the semiconductor device, in other words the breakdown voltage in a direction perpendicular to the thickness direction of the semiconductor device, can be increased to a sufficient degree due to the electric field concentration relieving near the upper surface of the semiconductor layer 2 by the RESURF effect, the breakdown voltage of the device as a whole is determined not by the breakdown voltage in the lateral direction, but by the breakdown voltage in the thickness direction directly under the impurity region 6. In the first preferred embodiment in which the breakdown voltage in the thickness direction directly under the impurity region 6 is increased as discussed above, the breakdown voltage of the device as a whole can be increased.

Figure 4:
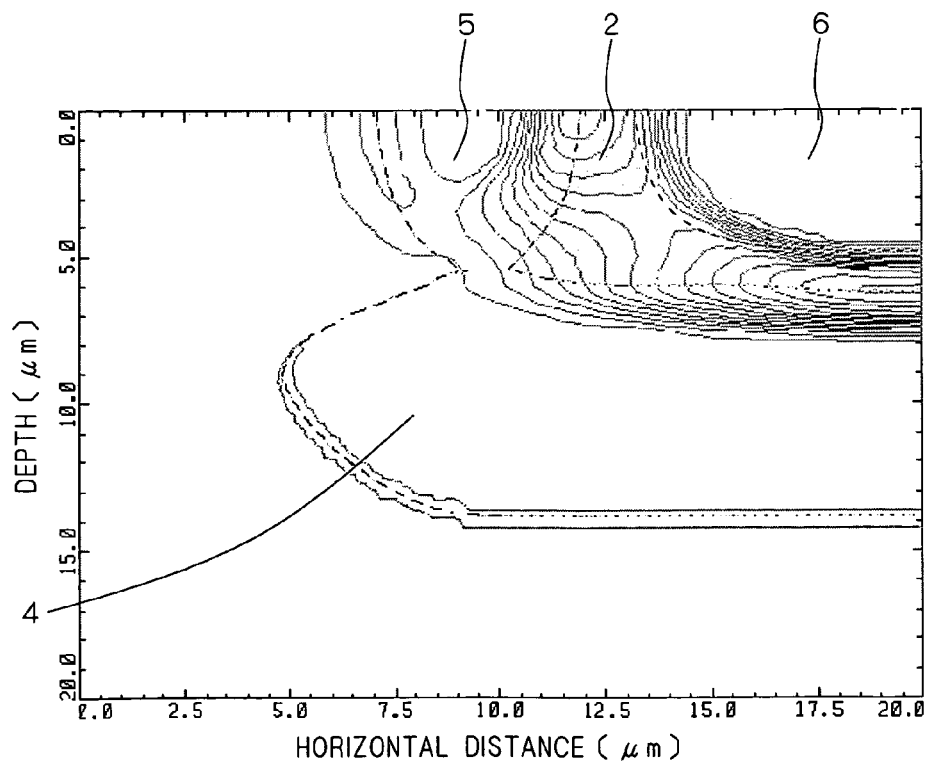
Figure 5:
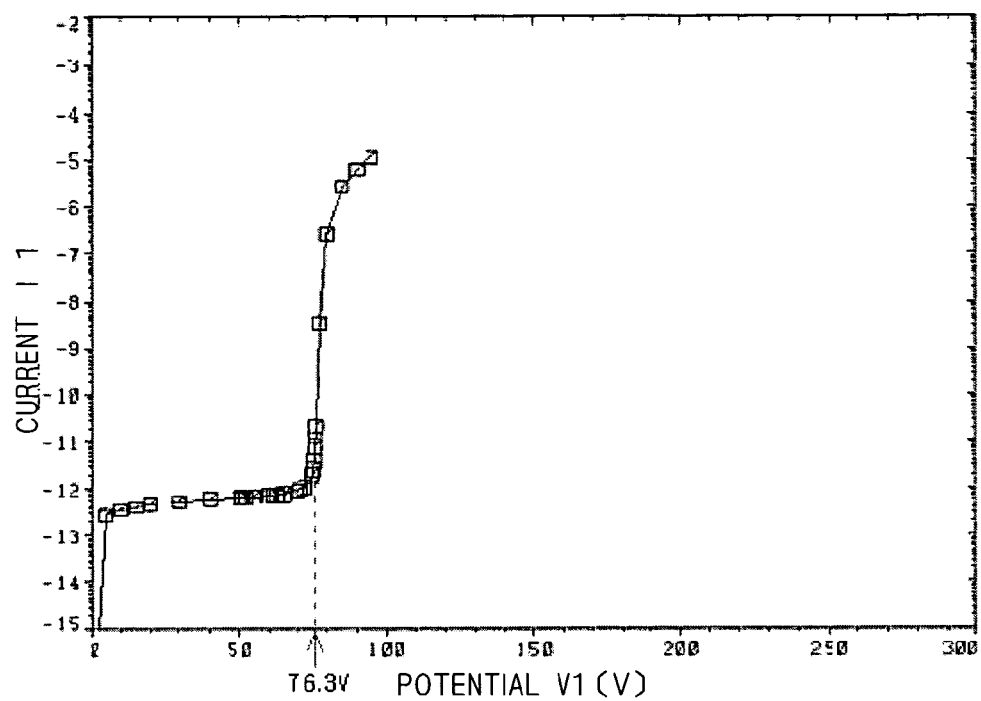
Figure 6:
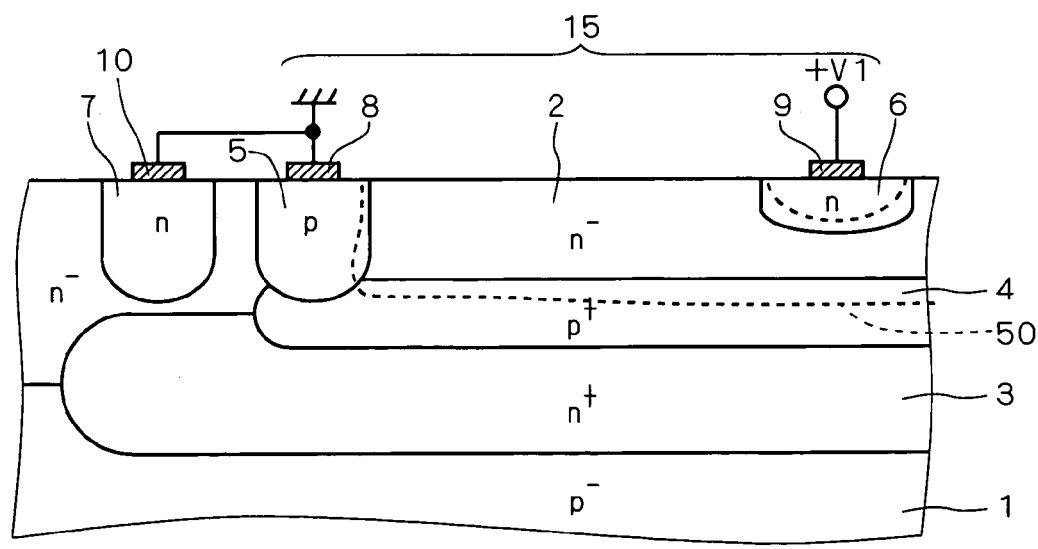
FIG. 6 shows a partial cross-sectional view of the structure of a device under comparison.

Subsequently, in order to better clarify the effect of this invention, operations are compared between the semiconductor device of the first preferred embodiment and a device shown in FIG. 1 of the above Ludikhuize document with slight modifications (hereinafter referred to as a "device under comparison"). FIGS. 2 to 5 show device simulation results regarding the operation of the semiconductor device of the first preferred embodiment. FIG. 6 shows a partial cross-sectional view of the structure of the device under comparison, and FIGS. 7 to 10 show device simulation results regarding the operation of the device under comparison. The device under comparison in FIG. 6 will be described first.

As shown in FIG. 6, the electrode 10 and the anode electrode 8 are electrically connected to each other, so the impurity regions 5 and 7 are electrically connected to each other in the device under comparison. Upon applying a reverse voltage to the diode element 15, almost the whole area of the semiconductor layer 2 surrounded by the impurity region 5 and the buried impurity region 4 is depleted. Unlike the semiconductor device of the first preferred embodiment, however, a depletion layer is hardly formed in the contact portion of the impurity region 5 and the buried impurity region 4 in the device under comparison. This is because depleting the contact portion would cause a leak current to flow between the electrode 10 and the cathode electrode 9 due to the electrical connection of the electrode 10 and the anode electrode 8. Therefore, the impurity region 5 and the buried impurity region 4 remain electrically connected to each other even when the impurity region 6 becomes higher in potential than the impurity region 5, and are thus equal in potential to each other.

In such ways, since the buried impurity region 4 is equal in potential to the impurity region 5 upon application of a reverse voltage to the diode element 15 in the device under comparison shown in FIG. 6, a potential difference between the impurity region 6 and the buried impurity region 4 directly thereunder becomes larger than that in the semiconductor device of the first preferred embodiment. Accordingly, the breakdown voltage in the thickness direction directly under the impurity region 6 is reduced.

Next, the device simulation results shown in FIGS. 2 to 5 and 7 to 10 will be described. FIGS. 2 to 4 and 7 to 9 show the results upon applying a ground potential to the impurity region 5 and 60 V to the impurity region 6 respectively. FIGS. 2 and 7 show equipotential lines every 1 V in the devices, and FIGS. 4 and 7 show equifield lines in the devices. FIGS. 3 and 8 show potential distributions in the thickness direction at the places where the impurity regions 5 and 6 are formed, and FIGS. 5 and 10 show the relationship between a potential V1 of the cathode electrode 9 and a reverse current I1 flowing through the diode element 15 when the impurity region 5 has a ground potential.

FIGS. 2, 4, 7 and 9 show the portion above the semiconductor substrate 1 of the structures shown in FIGS. 1 and 6, and do not indicate the boundary between the buried impurity region 3 and the semiconductor layer 2. Also, the simulation results shown in FIGS. 2 to 5 and 7 to 10 were obtained by calculation with an apparently narrower distance between the impurity regions 5 and 6 than in FIGS. 1 and 6. Accordingly, in FIGS. 2, 4, 7 and 9, the distance between the impurity regions 5 and 6 is apparently narrower than in FIGS. 1 and 6.

In FIGS. 3 and 8, data represented by square marks indicates the potential distribution in the thickness direction at the place where the impurity region 6 is formed, while data represented by circle marks indicates the potential distribution in the thickness direction at the place where the impurity region 5 is formed. The longitudinal axis in each of FIGS. 2, 4, 7 and 9 as well as the lateral axis in each of FIGS. 3 and 8 indicate a depth from the upper surface of the semiconductor layer 2, while a horizontal distance in the lateral axis in each of FIGS. 2, 4, 7 and 9 indicates a distance in the lateral direction from a prescribed position. The longitudinal axis in each of FIGS. 5 and 10 indicates the value of the reverse current I1 (in the unit ampere) in index with its bottom value being 10, when the thickness in a direction perpendicular to the sheet of drawing of the device is assumed to be 1 μm. For example, a value 1 μA ($10^{-6}$ A) of the reverse current I1 will be indicated as "−6" in the longitudinal axis in each of FIGS. 5 and 10.

Figure 9:
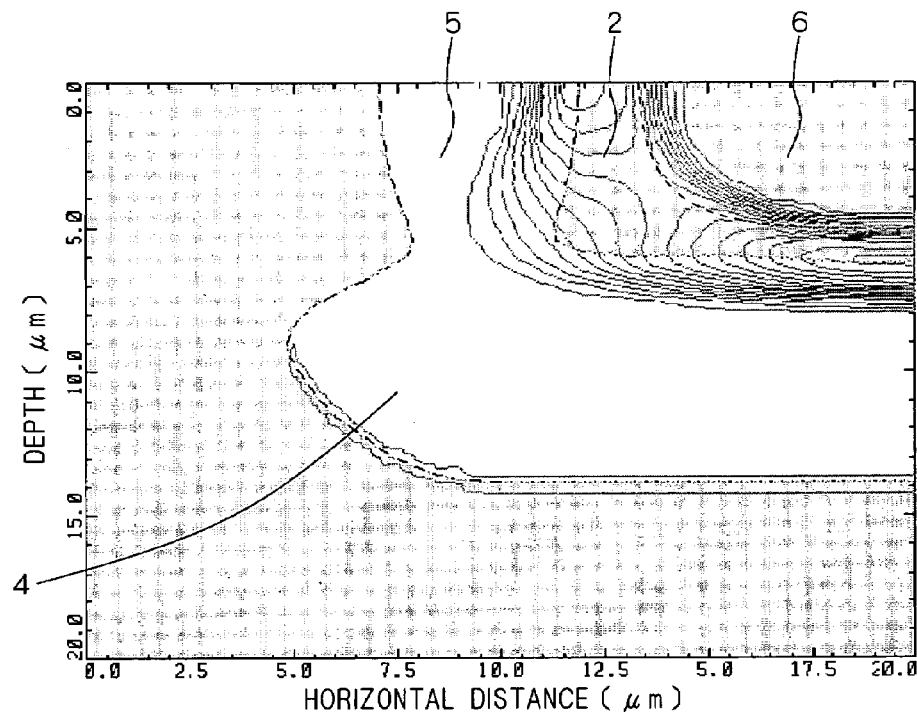
Figure 10:
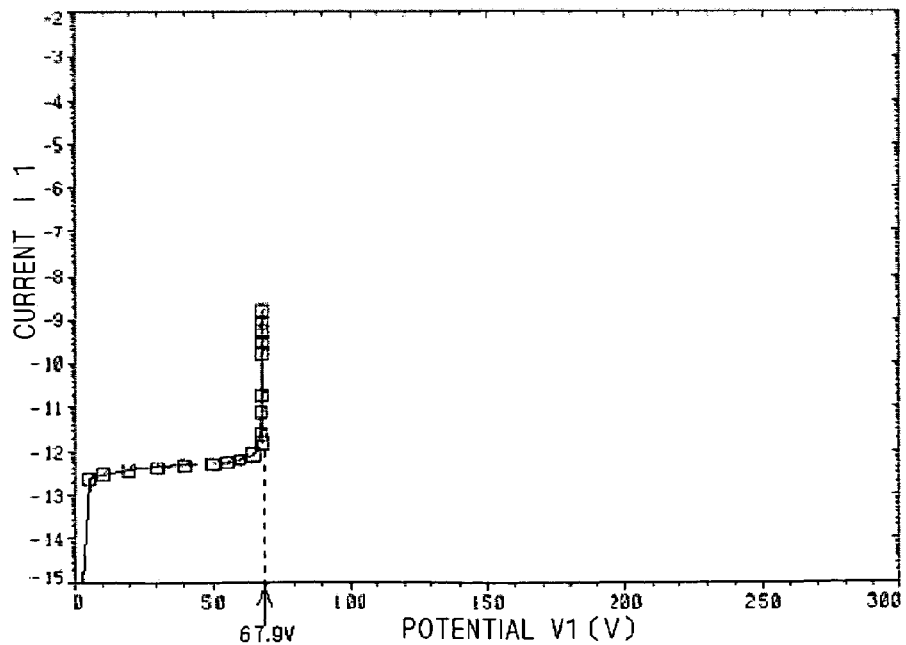

As shown in FIGS. 4 and 9, the electric field concentration appears in the lateral direction near the upper surface of the semiconductor layer 2 between the impurity regions 5 and 6, and in the thickness direction directly under the impurity region 6. Because the electric field concentration near the upper surface of the semiconductor layer 2 is relieved by the RESURF effect, the electric field is more intense directly under the impurity region 6 than near the upper surface of the semiconductor layer 2.

Further, in light of the fact that two or more equipotential lines will be formed in a region where a depletion layer is formed, it can be seen from the distribution of the equipotential lines in FIG. 2 that a depletion layer is formed from the bottom end of the impurity region 5 to the top end of the buried impurity region 4 in contact therewith, depleting the whole area of the contact portion of the impurity region 5 and the buried impurity region 4.

In the device under comparison in FIG. 6, because the impurity region 5 and the buried impurity region 4 remain electrically connected to each other even with the diode element 15 being applied with a reverse voltage, the buried impurity region 4 has a ground potential as indicated by the circle marks in FIG. 8. In the device under comparison, therefore, a voltage of 60 V is applied between the impurity region 6 and the buried impurity region 4.

On the other hand, in the semiconductor device of the first preferred embodiment, because the impurity region 5 and the buried impurity region 4 are electrically isolated from each other by the depletion layer, the buried impurity region 4 has a floating potential. Consequently, the potential of the buried impurity region 4 is attracted to the potential of the impurity region 6, and increased higher than a ground potential to reach approximately 5 V, as indicated by the circle marks in FIG. 3. In this semiconductor device, therefore, a voltage of approximately 55 V, which is lower than that in the device under comparison, is applied between the impurity region 6 and the buried impurity region 4.

In this manner, in the semiconductor device of the first preferred embodiment, a potential difference between the impurity region 6 and the buried impurity region 4 can be reduced correspondingly to the potential increase of the buried impurity region 4, thereby increasing the breakdown voltage of the semiconductor device correspondingly to the potential increase of the buried impurity region 4 when the electric field between the impurity region 6 and the buried impurity region 4 reaches the critical electric field. The device under comparison, in which the reverse current I1 increases sharply when the potential V1 of the cathode electrode 9 is 67.9 V as shown in FIG. 10, has a breakdown voltage of 67.9 V, whereas the semiconductor device of the first preferred embodiment, in which the reverse current I1 increases sharply when the potential V1 of the cathode electrode 9 is 76.3 V as shown in FIG. 5, has a breakdown voltage of 76.3 V. In short the breakdown voltage of the semiconductor device of the first preferred embodiment is increased by 8.4 V from that of the device under comparison.

Second Preferred Embodiment

As discussed above, upon applying a reverse voltage to the diode element 15 in the semiconductor device of the first preferred embodiment, the potential of the buried impurity region 4 which is electrically isolated from the impurity region 5 by the depletion layer is influenced by the potential of the impurity region 6 and increased. This is followed by a potential increase of the buried impurity region 3 forming a pn junction with the buried impurity region 4, which is followed by a potential increase of the semiconductor layer 2 outside the impurity region 5 which is in contact with the buried impurity region 3. Accordingly, in such semiconductor device in which the impurity region 5 is formed to make contact with the outer edge of the buried impurity region 4, and a depletion layer is formed poorly in the semiconductor layer 2 outside the impurity region 5 thus relieving poorly the electric field concentration near the upper surface of this semiconductor layer 2, avalanche breakdown occurs at a relatively low potential in this semiconductor layer 2. Upon occurrence of avalanche breakdown, the buried impurity region 3 connected to the semiconductor layer 2 outside the impurity region 5 controls the potential thereof to where the avalanche breakdown does not occur, which allows no further potential increase of the buried impurity region 4 forming the pn junction with the buried impurity region 3.

In such ways, because the electric field concentration near the upper surface of the semiconductor layer 2 outside the impurity region 5 is relived poorly, the semiconductor device of the first preferred embodiment may exhibit a phenomenon in which avalanche breakdown occurs at a relatively low potential, which does not allow a large amount of potential increase of the buried impurity region 4.

In view of the above, a semiconductor device capable of increasing the potential of the buried impurity region 4 reliably is provided in a second preferred embodiment.

Figure 11:
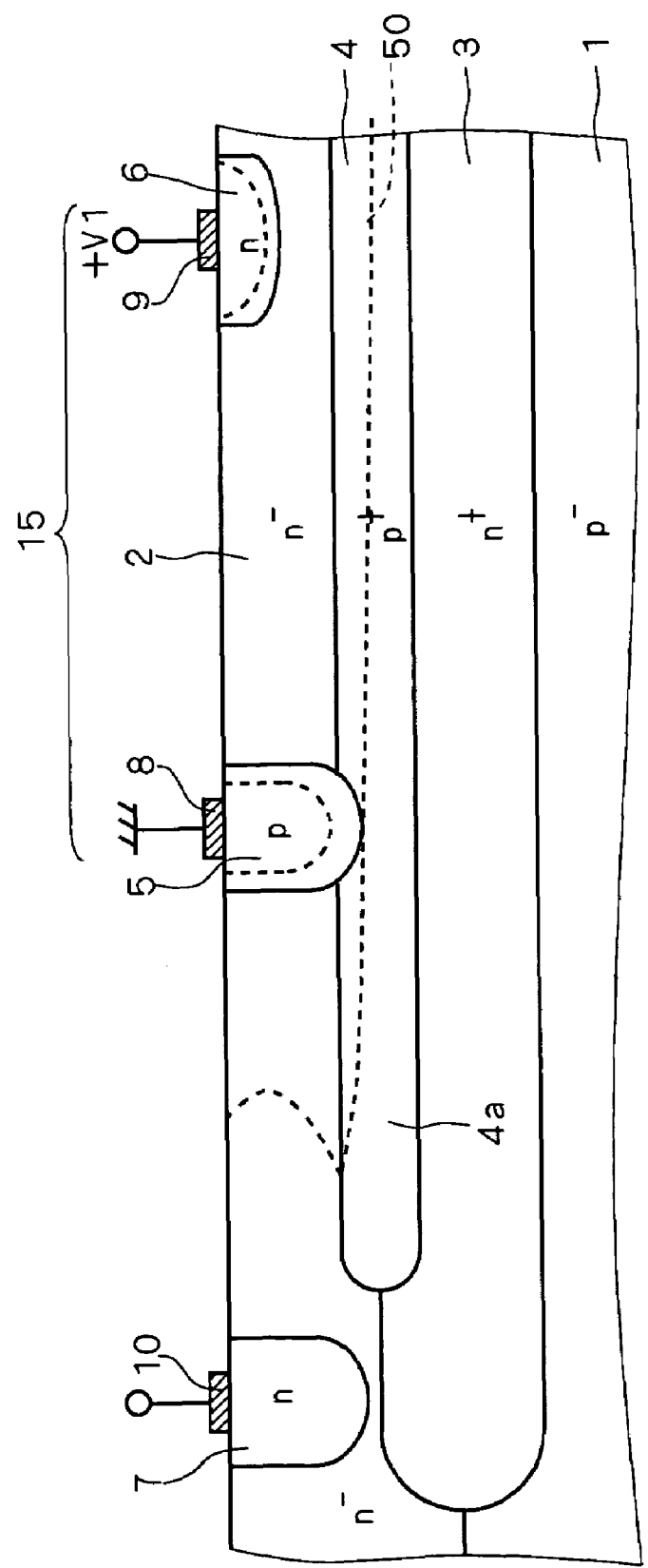
FIG. 11 shows a partial cross-sectional view of the structure of a semiconductor device according to a second preferred embodiment of this invention.

FIG. 11 shows a partial cross-sectional view of the structure of a semiconductor device according to the second preferred embodiment of this invention. This semiconductor device is similar to that of the first preferred embodiment except that the shapes of the buried impurity regions 3 and 4 are changed, and the impurity region 7 is moved correspondingly.

In this semiconductor device, as shown in FIG. 11, the outer edge of the buried impurity region 4 extends outward farther than the impurity region 5, namely, past the impurity region 5 to the side opposite to the impurity region 6. The outer edge of the buried impurity region 3 extends outward correspondingly, and the impurity region 7 is likewise moved outward. In short, the radiuses of the nearly circular buried impurity regions 3 and 4 are increased while keeping the places of the impurity regions 5 and 6, and the impurity region 7 is moved outward correspondingly to be located along the outer edge of the buried impurity region 3 in top view. The remaining parts of the structure are similar to those in the semiconductor device of the first preferred embodiment, and an explanation thereof is thus omitted.

In this manner, in the semiconductor device of the second preferred embodiment, the outer edge of the buried impurity region 4 extends past the impurity region 5 to the side opposite to the impurity region 6. Accordingly, upon applying a reverse voltage to the diode element 15, a depletion layer extends from a portion 4a as well, which is part of the buried impurity region 4 and located on the side opposite to the impurity region 6 with reference to the impurity region 5, and the semiconductor layer 2 above the portion 4a is easily depleted up to the upper surface thereof by the RESURF effect, as indicated by the broken lines 50 in FIG. 11. Consequently, the electric field concentration near the upper surface of the semiconductor layer 2 outside the impurity region 5 is relieved, which allows an increase in potential where avalanche breakdown occurs in this semiconductor layer 2. This allows a reliable potential increase of the buried impurity region 4. Therefore, a potential difference between the impurity region 6 and the buried impurity region 4 can be reduced, thereby increasing further the breakdown voltage in the thickness direction of this semiconductor device.

Third Preferred Embodiment

Figure 12:
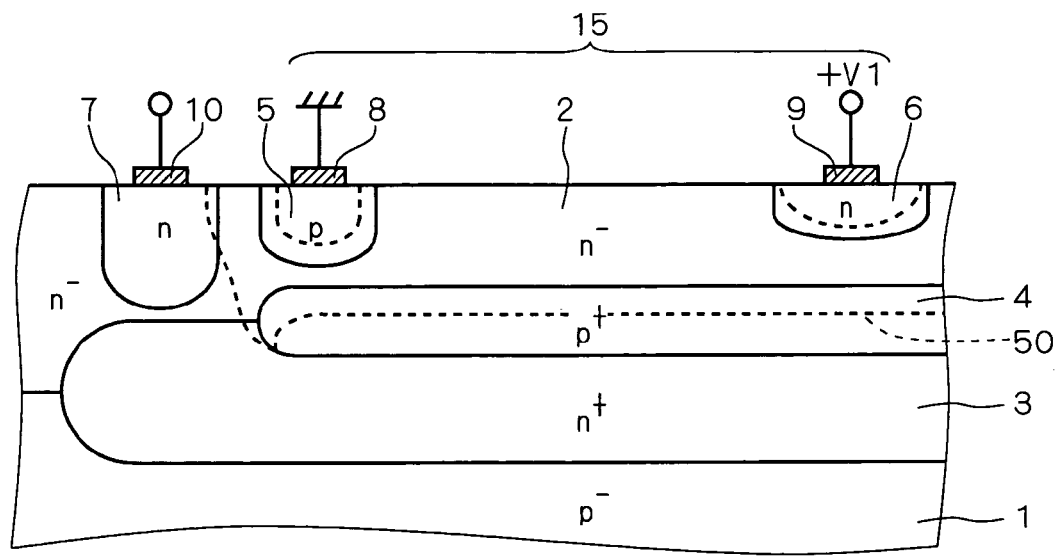
FIG. 12 shows a partial cross-sectional view of the structure of a semiconductor device according to a third preferred embodiment of this invention.

FIG. 12 shows a partial cross-sectional view of the structure of a semiconductor device according to a third preferred embodiment of this invention. This semiconductor device is similar to that of the first preferred embodiment except that the shape of the impurity region 5 is changed. In this semiconductor device, as shown in FIG. 12, the impurity region 5 is formed to be shallower than in the first preferred embodiment, and does not reach the buried impurity region 4. Accordingly, the semiconductor layer 2 exists between the impurity region 5 and the buried impurity region 4. The remaining parts of the structure are similar to those in the semiconductor device of the first preferred embodiment, and an explanation thereof is thus omitted.

Due to the existence of the semiconductor layer 2 between the impurity region 5 and the buried impurity region 4, a pn junction is formed by the impurity region 5 and the semiconductor layer 2 above the buried impurity region 4 in this semiconductor device. Accordingly, when the impurity region 6 becomes higher in potential than the impurity region 5 upon application of a reverse voltage to the diode element 15, a depletion layer is also formed in the whole area of the semiconductor layer 2 between the impurity region 5 and the buried impurity region 4, the electric field in the depletion layer being more intense than that in the depletion layer formed in the contact portion of the impurity region 5 and the buried impurity region 4 in the semiconductor device of the first preferred embodiment. The potential of the buried impurity region 4 is thus increased. Consequently, the breakdown voltage in the thickness direction of this semiconductor device is increased, thereby increasing the breakdown voltage of the device as a whole.

Figure 13:
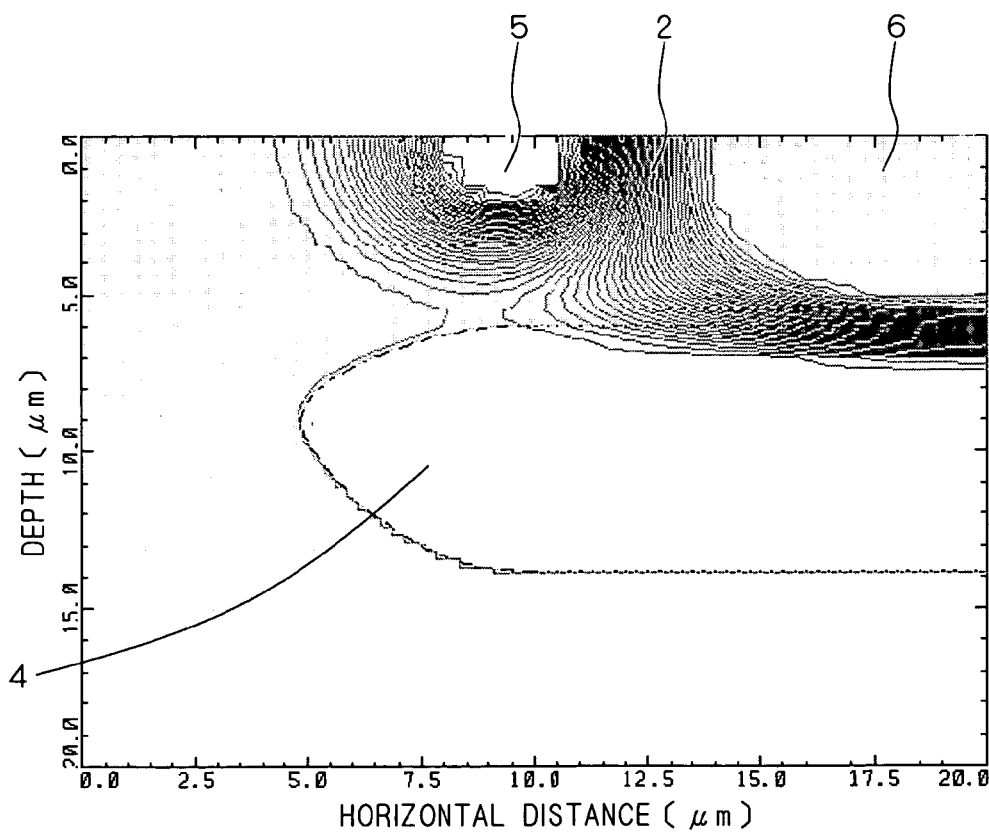
FIGS. 13 to 16 show simulation results regarding the operation of the semiconductor device according to the third preferred embodiment.
Figure 14:
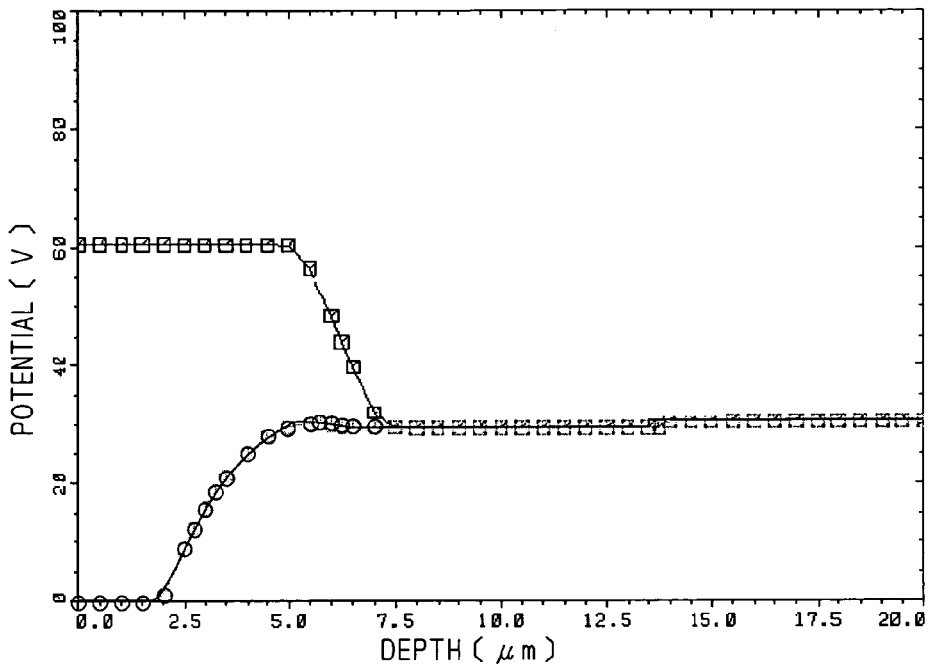
Figure 15:
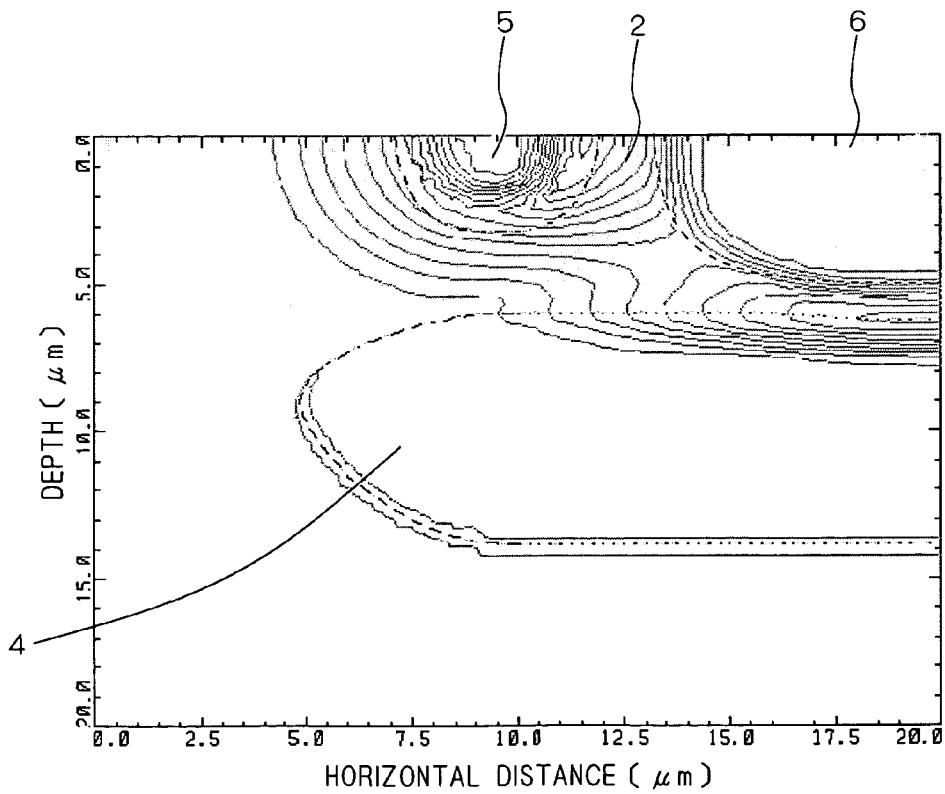
Figure 16:
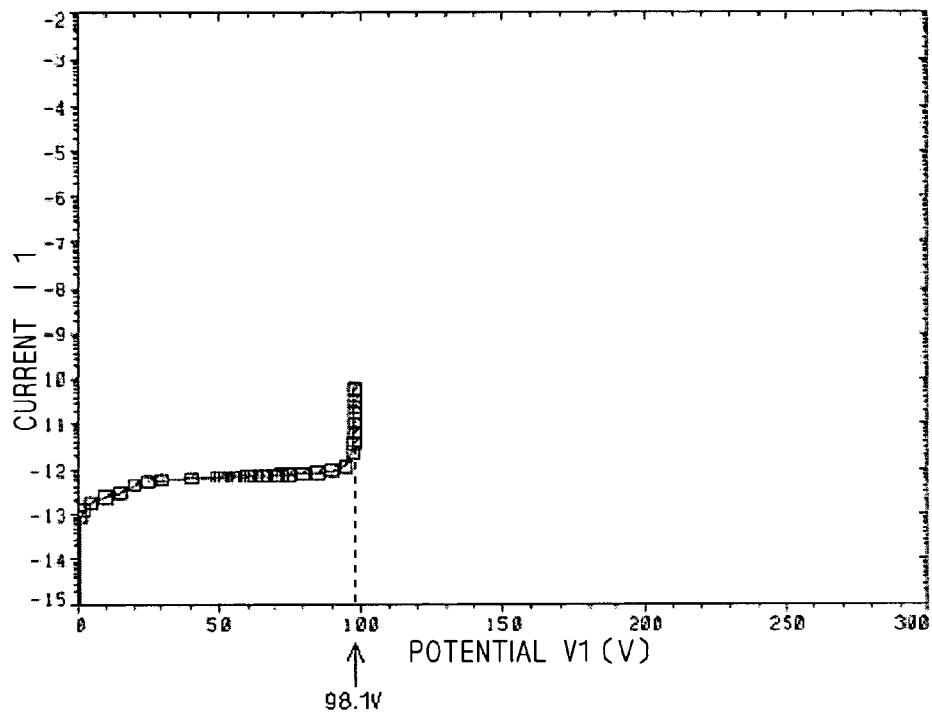

FIGS. 13 to 16 show device simulation results regarding the operation of the semiconductor device of the third preferred embodiment. FIGS. 13 to 15 show the results upon applying a ground potential to the impurity region 5 and 60 V to the impurity region 6 respectively. FIG. 13 shows equipotential lines every 1 V in the device, and FIG. 15 shows equifield lines in the device. FIG. 14 shows potential distributions in the thickness direction at the places where the impurity regions 5 and 6 are formed, data represented by square marks regarding the impurity region 6, and data represented by circle marks regarding the impurity region 5. FIG. 16 shows the relationship between the potential V1 of the cathode electrode 9 and the reverse current I1 flowing through the diode element 15 when the impurity region 5 has a ground potential.

FIGS. 13 and 15 show the portion above the semiconductor substrate 1 of the structure shown in FIG. 12, and do not indicate the boundary between the buried impurity region 3 and the semiconductor layer 2. Also, the simulation results shown in FIGS. 13 to 16 were obtained by calculation with an apparently narrower distance between the impurity regions 5 and 6 than in FIG. 12. Accordingly, in FIGS. 13 and 15, the distance between the impurity regions 5 and 6 is apparently narrower than in FIG. 12. The longitudinal and lateral axes in FIGS. 13 to 16 each indicate the same as those in FIGS. 2 to 5.

Referring to FIG. 15 and back to FIG. 4, it can be seen that the electric field in the depletion layer formed from the bottom end of the impurity region 5 to the top end of the buried impurity region 4 in the semiconductor device of the third preferred embodiment is more intense than that of the first preferred embodiment. As shown in FIG. 14, upon applying a reverse voltage of 60 V to the diode element 15, the potential of the buried impurity region 40 is increased to approximately 30 V.

In this manner, in the third preferred embodiment, the potential increase of the buried impurity region 4 leads to an increase of the breakdown voltage of the semiconductor device to 98.1 V, as shown in FIG. 16, which is increased by as much as 21.8 V from the semiconductor device of the first preferred embodiment.

Fourth Preferred Embodiment

Figure 17:
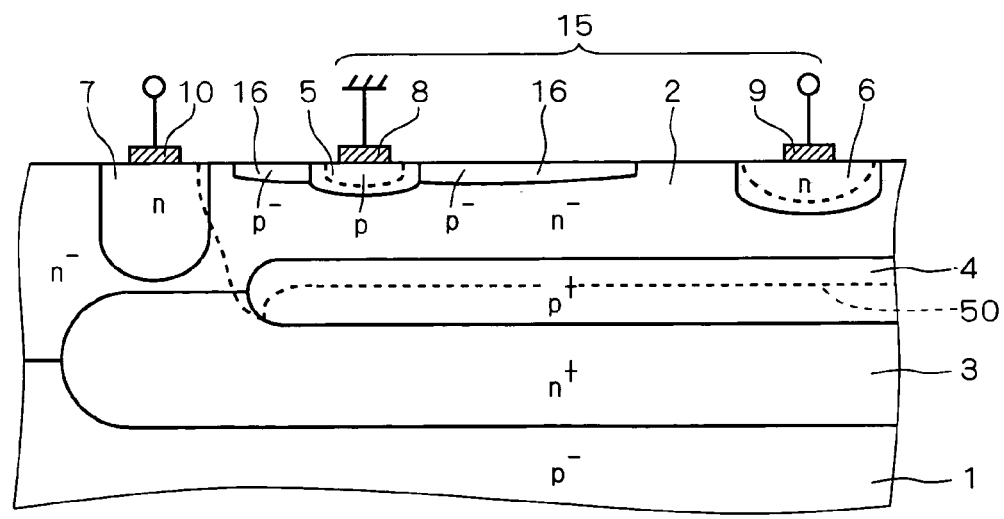
FIG. 17 shows a partial cross-sectional view of the structure of a semiconductor device according to a fourth preferred embodiment of this invention.

FIG. 17 shows a partial cross-sectional view of the structure of a semiconductor device according to a fourth preferred embodiment of this invention. This semiconductor device is similar to that of the third preferred embodiment except that an impurity region 16 of p⁻ type is additionally provided. As shown in FIG. 17, the impurity region 16 is formed adjacently to the impurity region 5 in the upper surface of the semiconductor layer 2. The impurity region 16 is provided to make contact with both the inside and outside of the annular impurity region 5, and surrounds the impurity region 6 while sandwiching the impurity region 5 in top view. The remaining parts of the structure are similar to those in the semiconductor device of the third preferred embodiment, and an explanation thereof is thus omitted.

In the semiconductor device of the third preferred embodiment described above, making the diffusion depth of the impurity region 5 shallow is effective in increasing the potential of the buried impurity region 4. However, a shallow impurity region 5 such as shown in FIG. 17 would lead to an increase in corner curvature in the ends of the impurity region 5 in a direction perpendicular to the depth direction, and the electric field concentration would easily appear in the ends. Thus, making the impurity region 5 shallow does not necessarily bring a large amount of potential increase of the buried impurity region 4.

In the fourth preferred embodiment, the impurity region 16 having a lower impurity concentration than the impurity region 5 is formed adjacently to the impurity region 5 in the upper surface of the semiconductor layer 2. Upon applying a revere voltage to the diode element 15, the whole area of the impurity region 16 having a low concentration can be depleted by utilizing the RESURF effect, which allows the electric field concentration in the ends of the impurity region 5 in the direction perpendicular to the depth direction to be relieved. Consequently, the potential of the buried impurity region 4 can be increased reliably, thereby increasing the breakdown voltage in the thickness direction of this semiconductor device reliably. The depleting of the whole area of the impurity region 16 would be easily achieved by adjusting the depth and the concentration of the impurity region 16.

Fifth Preferred Embodiment

Figure 18:
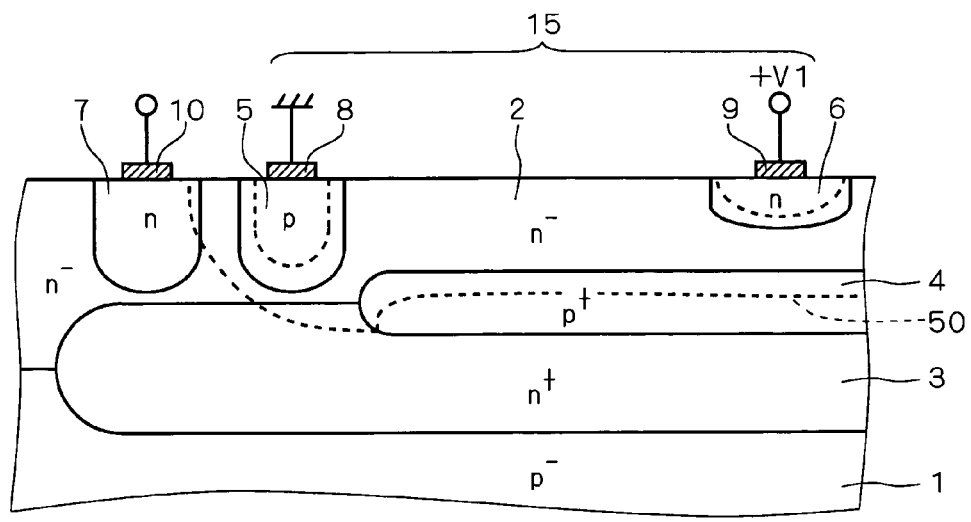
FIG. 18 shows a partial cross-sectional view of the structure of a semiconductor device according to a fifth preferred embodiment of this invention.

FIG. 18 shows a partial cross-sectional view of the structure of a semiconductor device according to a fifth preferred embodiment of this invention. This semiconductor device is similar to that of the first preferred embodiment except that the shape of the buried impurity region 4 is changed. In this semiconductor device, as shown in FIG. 18, the outer edge of the buried impurity region 4 does not extend to the impurity region 5, so the buried impurity region 4 does not exist directly under the impurity region 5. The remaining parts of the structure are similar to those in the semiconductor device of the first preferred embodiment, and an explanation thereof is thus omitted.

In order to transform the semiconductor device of the first preferred embodiment in which the buried impurity region 4 exists directly under the impurity region 5 into the semiconductor device of the third preferred embodiment in which the impurity region 5 does not make contact with the buried impurity region 4, the depth of the impurity region 5 needs to be changed.

In the semiconductor device of the fifth preferred embodiment, due to the nonexistence of the buried impurity region 4 directly under the impurity region 5, it is possible to prevent the impurity region 5 from making contact with the buried impurity region 4 with no change in depth. Therefore, a high breakdown voltage is easily achieved only by changing masking steps without changing diffusing steps.

Sixth Preferred Embodiment

In the semiconductor device of each of the first to fifth preferred embodiments described above, the floating state the buried impurity region 4 is in independently may cause a pnp type parasitic bipolar transistor to operate resulting in a possible malfunction in the semiconductor device, the parasitic bipolar transistor consisting of the impurity region 5 as a base, the semiconductor layer 2 outside the impurity region 5, the impurity region 7 and the buried impurity region 3 as an emitter, and the semiconductor substrate 1 as a collector.

In view of the above, a semiconductor device capable of preventing the operation of the parasitic bipolar transistor reliably is provided in a sixth preferred embodiment.

Figure 19:
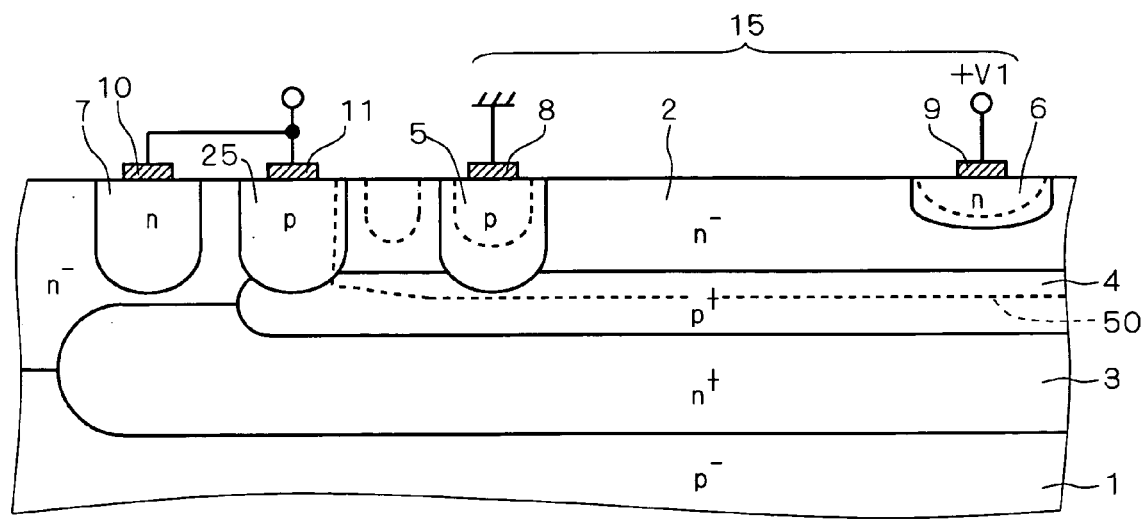
FIG. 19 shows a partial cross-sectional view of the structure of a semiconductor device according to a sixth preferred embodiment of this invention.

FIG. 19 shows a partial cross-sectional view of the structure of a semiconductor device according to the sixth preferred embodiment of this invention. This semiconductor device is similar to that of the first preferred embodiment except that the shapes of the buried impurity regions 3 and 4 are changed, the impurity region 7 is moved correspondingly, and an impurity region 25 of p type and an electrode 11 are additionally provided.

In this semiconductor device, as shown in FIG. 19, the outer edge of the buried impurity region 4 extends outward farther than the impurity region 5, as in the second preferred embodiment. The outer edge of the buried impurity region 3 extends outward correspondingly, and the impurity region 7 is likewise moved outward. In addition, the impurity region 25 is formed in the upper surface of the semiconductor layer 2 between but apart from the impurity regions 5 and 7. The impurity region 25 reaches the buried impurity region 4, and is formed along the outer edge of the buried impurity region 4 to center and surround the impurity region 6 in top view. Further, the electrode 11 is provided on the upper surface of the impurity region 25, which is electrically connected only to the electrode 10 other than the impurity region 25. Consequently, the impurity regions 7 and 25 are electrically connected to each other and floating in potential. The remaining parts of the structure are similar to those in the semiconductor device of the first preferred embodiment, and an explanation thereof is thus omitted.

Upon applying a reverse voltage to the diode element 15 in this semiconductor device, a depletion layer is formed from the bottom end of the impurity region 5 to the top end of the buried impurity region 4 in contact therewith, as in the first preferred embodiment. Consequently, the impurity region 5 and the buried impurity region 4 are electrically isolated from each other by the depletion layer.

In contrast to this, a depletion layer is hardly formed from the bottom end of the impurity region 25 to the top end of the buried impurity region 4 due to the electrical connection of the impurity regions 25 and 7. Consequently, the impurity region 25 and the buried impurity region 4 remain electrically connected to each other.

In this manner, because the impurity region 25 and the buried impurity region 4 remain electrically connected to each other in the semiconductor device of the sixth preferred embodiment due to the electrical connection of the impurity regions 25 and 7 even with the diode element 15 being applied with a reverse voltage, an n type semiconductor region consisting of the semiconductor layer 2 outside the impurity region 25, the impurity region 7 and the buried impurity region 3, and a p type semiconductor region consisting of the impurity region 25 and the buried impurity region 4 are electrically connected to each other. Accordingly, in a pnp type parasitic bipolar transistor consisting of the p type semiconductor region as a base, the n type semiconductor region as an emitter, and the semiconductor substrate 1 as a collector, a short circuit occurs between the base and the emitter. Therefore, the operation of the parasitic bipolar transistor is prevented reliably.

Seventh Preferred Embodiment

Figure 20:
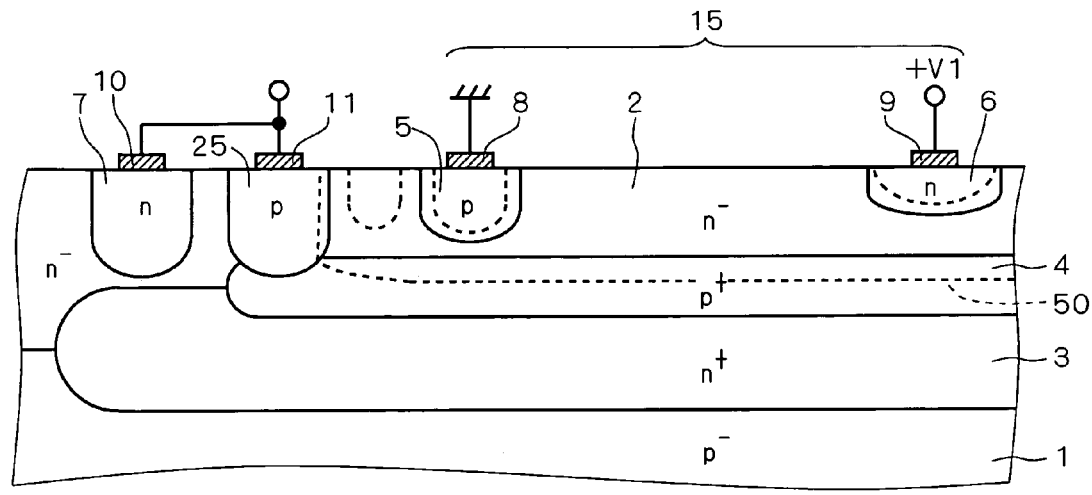
FIG. 20 shows a partial cross-sectional view of the structure of a semiconductor device according to a seventh preferred embodiment of this invention.

FIG. 20 shows a partial cross-sectional view of the structure of a semiconductor device according to a seventh preferred embodiment of this invention. This semiconductor device is similar to that of the sixth preferred embodiment except that the shape of the impurity region 5 is changed. In this semiconductor device, as shown in FIG. 20, the impurity region 5 is formed to be shallow and does not reach the buried impurity region 4, as in the third preferred embodiment. Accordingly, the semiconductor layer 2 exists between the impurity region 5 and the buried impurity region 4. The remaining parts of the structure are similar to those in the semiconductor device of the sixth preferred embodiment, and an explanation thereof is thus omitted.

Due to the existence of the semiconductor layer 2 between the impurity region 5 and the buried impurity region 4, upon applying a reverse voltage to the diode element 15, the potential of the buried impurity region 4 is increased higher than in the semiconductor device of the sixth preferred embodiment, for the reasons explained in the third preferred embodiment. Consequently, the breakdown voltage in the thickness direction of this semiconductor device is increased, thereby increasing the breakdown voltage of the device as a whole.

Eighth Preferred Embodiment

Figure 21:
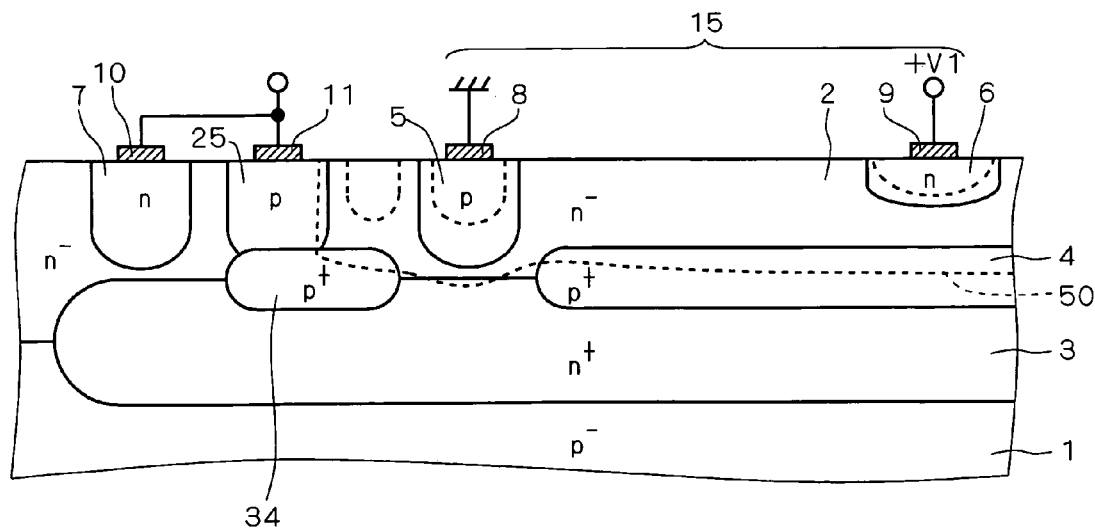
FIG. 21 shows a partial cross-sectional view of the structure of a semiconductor device according to an eighth preferred embodiment of this invention.

FIG. 21 shows a partial cross-sectional view of the structure of a semiconductor device according to an eighth preferred embodiment of this invention. This semiconductor device is similar to that of the sixth preferred embodiment except that the shape of the buried impurity region 4 is changed, and a buried impurity region 34 of p$^+$ type is additionally provided.

In this semiconductor device, as shown in FIG. 21, the outer edge of the buried impurity region 4 does not extend to the impurity region 5, so the buried impurity region 4 does not exist directly under the impurity region 5, as in the fifth preferred embodiment. In addition, the buried impurity region 34 is formed at the interface between the semiconductor layer 2 and the buried impurity region 3, on the side opposite to the impurity region 6 with reference to the impurity region 5, the buried impurity region 34 being annular to center and surround the impurity region 6 in top view. The impurity region 25 reaches the buried impurity region 34, and is formed along the buried impurity region 34 in top view. The remaining parts of the structure are similar to those in the semiconductor device of the sixth preferred embodiment, and an explanation thereof is thus omitted.

Upon applying a reverse voltage to the diode element 15 in this semiconductor device, the impurity region 5 and the buried impurity region 4 are electrically isolated from each other by a depletion layer. In contrast to this, a depletion layer is hardly formed from the bottom end of the impurity region 25 to the top end of the buried impurity region 34 due to the electrical connection of the impurity regions 25 and 7, so the impurity region 25 and the buried impurity region 34 remain electrically connected to each other.

In the semiconductor device of the eighth embodiment, due to the nonexistence of the buried impurity region 4 directly under the impurity region 5, it is possible to prevent the impurity region 5 from making contact with the buried impurity region 4 with no change in depth. Therefore, a high breakdown voltage is easily achieved only by changing masking steps without changing diffusing steps.

Moreover, because the impurity region 25 and the buried impurity region 34 remain electrically connected to each other due to the electrical connection of the impurity region 25 and 7 even with the diode element 15 being applied with a reverse voltage, an n type semiconductor region consisting of the semiconductor layer 2 outside the impurity region 25, the impurity region 7 and the buried impurity region 3, and a p type semiconductor region consisting of the impurity region 25 and the buried impurity region 34 are electrically connected to each other. Accordingly, in a pnp type parasitic bipolar transistor consisting of the p type semiconductor region as a base, the n type semiconductor region as an emitter, and the semiconductor substrate 1 as a collector, a short circuit occurs between the base and the emitter. Therefore, the operation of the parasitic bipolar transistor is prevented reliably.

Although they are not connected, the buried impurity regions 4 and 34 may alternatively be connected to each other. For example, the impurity region 5 may be formed not in perfect annular shape but in the shape of the letter "C" to leave a partial small clearance, to the extent that the RESURF effect is exerted sufficiently, and another buried impurity region for connecting between the buried impurity regions 4 and 34 may be formed in that clearance.

Although the buried impurity region 4 enters a floating state independently when not connected to the buried impurity region 34, by electrically connecting the impurity regions 25 and 7 as in the eighth preferred embodiment, it is possible to reliably prevent the operation of the parasitic bipolar transistor in this semiconductor device due to the transistor's tendency to operate at the outside of the impurity region 5 having a relatively low breakdown voltage.

Ninth Preferred Embodiment

Upon applying a forward voltage to the diode element 15 by applying a ground potential to the anode electrode 8 and a negative potential to the cathode electrode 9 in the semiconductor devices of the sixth and seventh preferred embodiments described above, an increase of this forward voltage causes conductivity modulation to occur in the semiconductor layer 2 between the impurity regions 5 and 6, and both holes and electrons to increase in concentration. In the sixth preferred embodiment, the increased electrons then pass through the contact portion of the impurity region 5 and the buried impurity region 4, due to a relatively low impurity concentration in that portion, and leak outward farther than the impurity region 5. In the seventh preferred embodiment, the increased electrons then pass through the semiconductor layer 2 and leak outward farther than the impurity region 5. The leaked electrons then pass through the contact portion of the impurity region 25 and the buried impurity region 4, due to a relatively low impurity concentration in that portion, and further reach the impurity region 7.

The impurity regions 7 and 25 are equal in potential near the surfaces thereof due to a short circuit between the electrodes 10 and 11. However, once injected with the electrons, the impurity region 7 decreases in potential near the bottom end thereof, which causes the buried impurity region 3 to decrease in potential as well correspondingly. As a result, the impurity region 25 and the buried impurity region 4 may become higher in potential than the buried impurity region 3. A potential difference thus occurs between the emitter and the base of the parasitic bipolar transistor described above, possibly causing the transistor to operate.

Likewise, in the semiconductor device of the eighth preferred embodiment described above, an increase in forward voltage applied to the diode element 15 may cause conductivity modulation to occur in the semiconductor layer 2 between the impurity regions 5 and 6, and electrons to leak outward farther than the impurity region 5 and pass through the contact portion of the impurity region 25 and the buried impurity region 34 to reach the impurity region 7. Upon arrival of the electrons, the impurity region 7 decreases in potential near the bottom end thereof, which causes the buried impurity region 3 to decrease in potential as well correspondingly. As a result, the impurity region 25 and the buried impurity region 34 may become higher in potential than the buried impurity region 3, possibly causing the parasitic bipolar transistor to operate.

In view of the above, a semiconductor device capable of preventing the operation of the parasitic bipolar transistor when the impurity region 6 becomes lower in potential than the impurity region 5 is provided in a ninth preferred embodiment.

Figure 22:
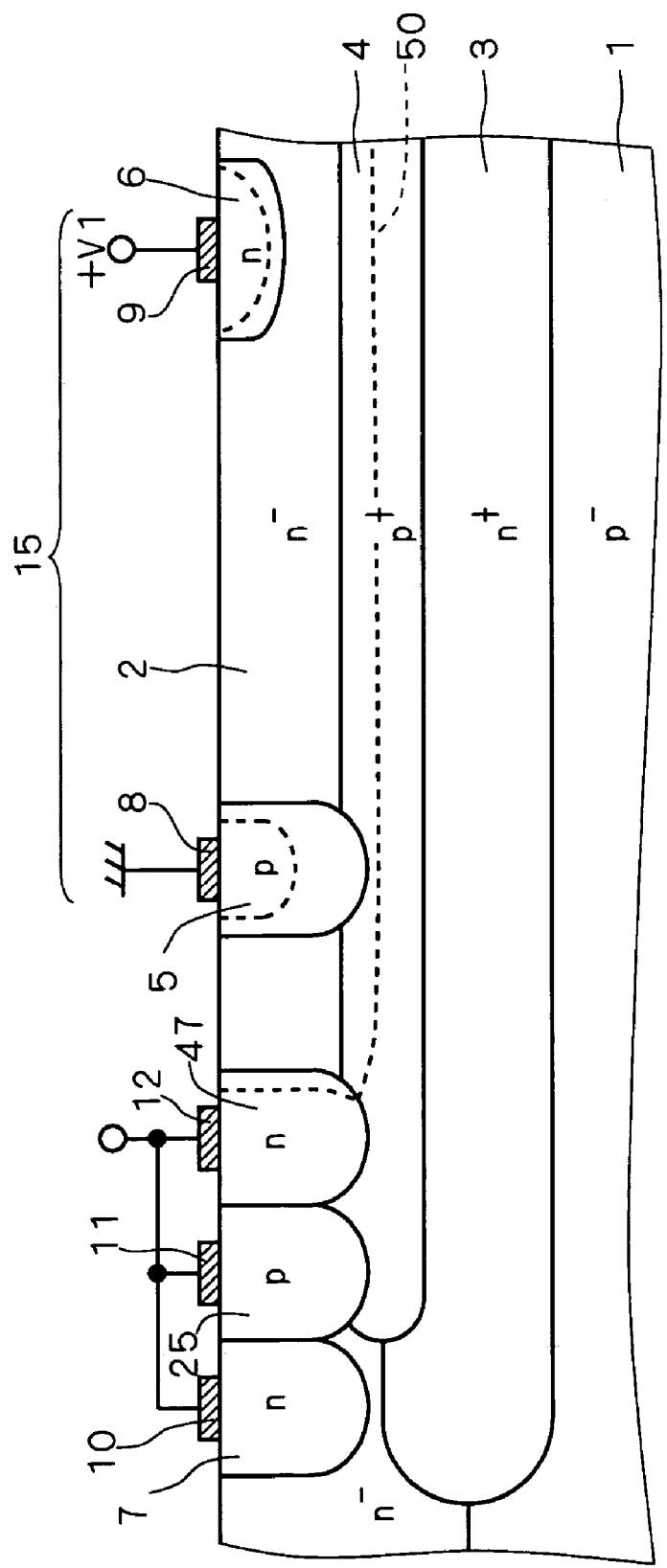
FIG. 22 shows a partial cross-sectional view of the structure of a semiconductor device according to a ninth preferred embodiment of this invention.

FIG. 22 shows a partial cross-sectional view of the structure of a semiconductor device according to the ninth preferred embodiment of this invention. This semiconductor device is similar to that of the sixth preferred embodiment except that an impurity region 47 of n type and an electrode 12 are additionally provided.

As shown in FIG. 22, the impurity region 47 is formed in the upper surface of the semiconductor layer 2 between the impurity regions 5 and 25, apart from the impurity region 5. The impurity region 47 reaches the buried impurity region 4, and is formed in annular shape to center and surround the impurity region 6 in top view. The electrode 12 is provided on the impurity region 47, which is electrically connected only to the electrodes 10 and 11 other than the impurity region 47. Consequently, the impurity regions 7, 25 and 47 are electrically connected to each other and floating in potential.

Further, the impurity regions 7 and 25, and the impurity regions 25 and 47, are formed adjacently to each other, respectively. The remaining parts of the structure are similar to those in the semiconductor device of the sixth preferred embodiment, and an explanation thereof is thus omitted.

Upon applying a reverse voltage to the diode element 15 in this semiconductor device, the impurity region 5 and the buried impurity region 4 are electrically isolated from each other by a depletion layer, while the impurity region 25 and the buried impurity region 4 remain electrically connected to each other, as in the sixth preferred embodiment.

Due to the existence of the impurity region 47 of n type between the impurity regions 5 and 25, when the impurity region 6 becomes lower in potential than the impurity region 5, and electrons start leaking outward farther than the impurity region 5 resulting from conductivity modulation in the semiconductor layer 2, the electrons first reach the impurity region 47. The electrons then bond with holes supplied from the impurity region 25 of p type, which is electrically connected to the impurity region 47, to become nonexistent. Consequently, the electrons passing through the contact portion of the impurity regions 25 and the buried impurity region 4 decrease in number, thus preventing the operation of the parasitic bipolar transistor.

Although the impurity region 47 is formed to reach the buried impurity region 4, it is not required as such.

In addition, by forming the impurity region 47 electrically connected to the impurity region 25 in the upper surface of the semiconductor layer 2 between the impurity regions 25 and 5 in the semiconductor device of the eighth preferred embodiment as well, as in the ninth preferred embodiment, the operation of the parasitic bipolar transistor when the impurity region 6 becomes lower in potential than the impurity region 5 is prevented. In that case, the impurity region 47 should be formed to, or not to, reach the buried impurity region 34.

Tenth Preferred Embodiment

While this invention is applied to a semiconductor device including a diode element in the first to ninth preferred embodiments described above, it will be applied to a semiconductor device including an nMOS transistor in a tenth preferred embodiment, and to a semiconductor device including an npn type bipolar transistor in an eleventh preferred embodiment which will be described later.

Figure 23:
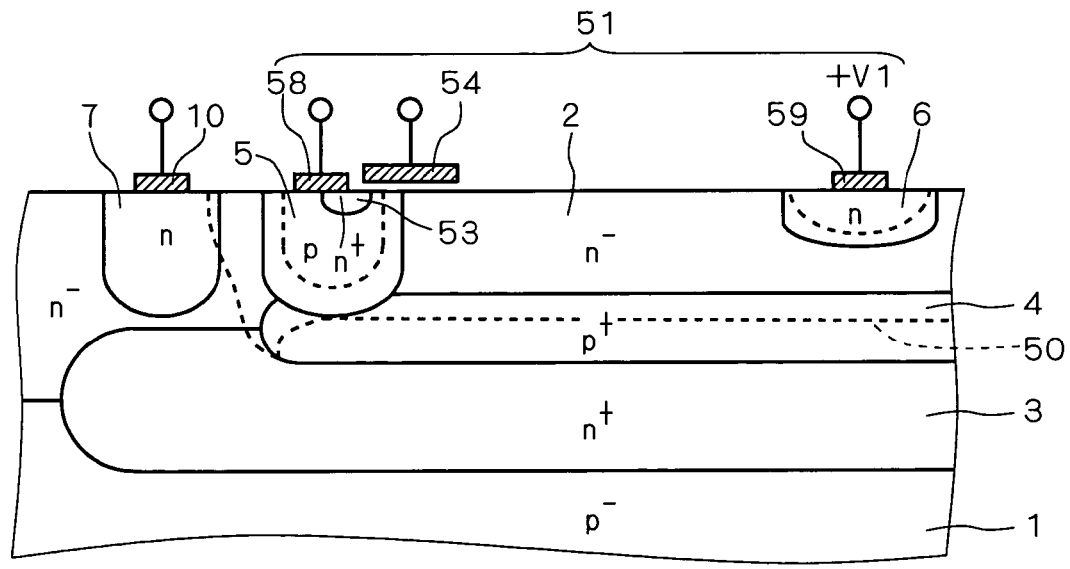
FIG. 23 shows a partial cross-sectional view of the structure of a semiconductor device according to a tenth preferred embodiment of this invention.

FIG. 23 shows a partial cross-sectional view of the structure of a semiconductor device according to the tenth preferred embodiment of this invention. This semiconductor device is similar to that of the first preferred embodiment except that an impurity region 53 of n type is additionally provided, and the anode electrode 8 and the cathode electrode 9 of the diode element 15 are replaced with a source electrode 58, a drain electrode 59 and a gate electrode 54 of an nMOS transistor 51.

In this semiconductor device, as shown in FIG. 23, the impurity region 53 is formed in an upper surface of the impurity region 5. The gate electrode 54 is formed via a not shown gate insulating film on the impurity region 5 between the semiconductor layer 2 between the impurity regions 5 and 6, and the impurity region 53. The drain electrode 59 is provided on the impurity region 6, and the source electrode 58 on the impurity regions 5 and 53. The remaining parts of the structure are similar to those in the semiconductor device of the first preferred embodiment, and an explanation thereof is thus omitted.

Upon applying a ground potential to the source electrode 58 and a positive potential of several tens of volts to the drain electrode 59 in this semiconductor device, the impurity region 6 becomes higher in potential than the impurity region 5, and a depletion layer is formed by the RESURF effect in almost the whole area of the semiconductor layer 2 between the impurity regions 5 and 6, as in the first preferred embodiment. Consequently, the electric field concentration near the upper surface of the semiconductor layer 2 is relieved, thereby achieving a high breakdown voltage of the semiconductor device.

Further, when the impurity region 6 becomes higher in potential than the impurity region 5, the impurity region 5 and the buried impurity region 4 are electrically isolated from each other by the depletion layer, as in the first preferred embodiment. The broken lines 50 in FIG. 23 indicate the margins of the depletion layer upon application of a higher potential to the drain electrode 59 than to the source electrode 58, only in characteristic portions. As can been seen from the shape formed by the broken lines 50, when the impurity region 6 becomes higher in potential than the impurity region 5, the whole area of the contact portion of the impurity region 5 and the buried impurity region 4 is depleted, and the impurity region 5 and the buried impurity region 4 are electrically isolated from each other by the depletion layer.

Due to the electrical isolation between the impurity region 5 and the buried impurity region 4 by the depletion layer, the buried impurity region 4 floats in potential. Consequently, the potential of the buried impurity region 4 is influenced by the potential of the impurity region 6, and increased higher than the potential of the impurity region 5. This reduces a potential difference between the impurity region 6 and the buried impurity region 4 directly thereunder further than when the buried impurity region 4 and the impurity region 5 are equal in potential to each other. Therefore, the breakdown voltage in the thickness direction directly under the impurity region 6 is increased.

In this semiconductor device, the impurity region 5 and the semiconductor layer 2 adjacent thereto form a parasitic diode having a lateral structure. The breakdown voltage of this parasitic diode is one of factors responsible for determining the breakdown voltage of the nMOS transistor 51.

In addition, by additionally forming the impurity region 53 in the upper surface of the impurity region 5, and replacing the anode electrode 8 and the cathode electrode 9 with the aforementioned source electrode 58, drain electrode 59 and gate electrode 54 in the semiconductor device of each of the second to eighth preferred embodiments as well, as in the tenth preferred embodiment, the inventions according to the respective embodiments can be applied to a semiconductor device including the nMOS transistor 51.

Moreover, when the nMOS transistor 51 performs switching drive of a load having an inductor element, the source electrode 58 may become higher in potential than the drain electrode 59, which renders the impurity region 5 higher in potential than the impurity region 6. Accordingly, conductivity modulation may occur in the semiconductor layer 2 between the impurity regions 5 and 6 in this semiconductor device as well. In view of this, by additionally forming the impurity region 53 in the upper surface of the impurity region 5, and replacing the anode electrode 8 and the cathode electrode 9 with the aforementioned source electrode 58, drain electrode 59 and gate electrode 54 in the semiconductor device of the ninth preferred embodiment as well, as in the tenth preferred embodiment, the operation of the parasitic bipolar is prevented in a semiconductor device including the nMOS transistor 51.

Eleventh Preferred Embodiment

Figure 24:
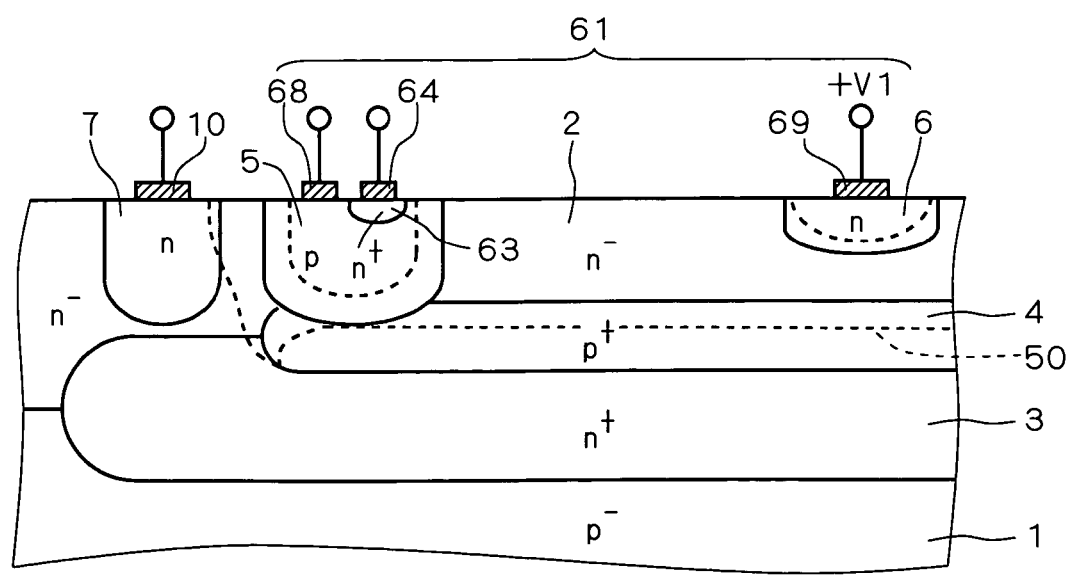
FIG. 24 shows a partial cross-sectional view of the structure of a semiconductor device according to an eleventh preferred embodiment of this invention.

FIG. 24 shows a partial cross-sectional view of the structure of a semiconductor device according to an eleventh preferred embodiment of this invention. This semiconductor device is similar to that of the first preferred embodiment except that an impurity region 63 of n type is additionally provided, and the anode electrode 8 and the cathode electrode 9 of the diode element 15 are replaced with a base electrode 68, a collector electrode 69 and an emitter electrode 64 of an npn type bipolar transistor 61.

In this semiconductor device, as shown in FIG. 24, the impurity region 63 is formed in the upper surface of the impurity region 5. The base electrode 68, the collector electrode 69 and the emitter electrode 64 are provided on the impurity regions 5, 6 and 63, respectively. The remaining parts of the structure are similar to those in the semiconductor device of the first preferred embodiment, and an explanation thereof is thus omitted.

Upon applying a ground potential to the base electrode 68 and a positive potential of several tens of volts to the collector electrode 69 in this semiconductor device, the impurity region 6 becomes higher in potential than the impurity region 5, and a depletion layer is formed by the RESURF effect in almost the whole area of the semiconductor layer 2 between the impurity regions 5 and 6, as in the first preferred embodiment. Consequently, the electric field concentration near the upper surface of the semiconductor layer 2 is relieved, thereby achieving a high breakdown voltage of the semiconductor device.

Further, when the impurity region 6 becomes higher in potential than the impurity region 5, the impurity region 5 and the buried impurity region 4 are electrically isolated from each other by the depletion layer, as in the first preferred embodiment. The broken lines 50 in FIG. 24 indicate the margins of the depletion layer upon application of a higher potential to the collector electrode 69 than to the base electrode 68, only in characteristic portions. As can been seen from the shape formed by the broken lines 50, when the impurity region 6 becomes higher in potential than the impurity region 5, the whole area of the contact portion of the impurity region 5 and the buried impurity region 4 is depleted, and the impurity region 5 and the buried impurity region 4 are electrically isolated from each other by the depletion layer.

Due to the electrical isolation between the impurity region 5 and the buried impurity region 4 by the depletion layer, the buried impurity region 4 floats in potential. Consequently, the potential of the buried impurity region 4 is influenced by the potential of the impurity region 6, and increased higher than the potential of the impurity region 5. This reduces a potential difference between the impurity region 6 and the buried impurity region 4 directly thereunder. Therefore, the breakdown voltage in the thickness direction directly under the impurity region 6 is increased.

In this semiconductor device, the impurity region 5 and the semiconductor layer 2 adjacent thereto form a parasitic diode having a lateral structure. The breakdown voltage of this parasitic diode corresponds to a breakdown voltage BVCBO of the npn type bipolar transistor 61. And the breakdown voltage BVCBO, which corresponds to the breakdown voltage of the npn type bipolar transistor 61, decreases from the breakdown voltage BVCBO which is an upper limit, depending on the value of a current amplification factor hFE. Therefore, the breakdown voltage of the parasitic diode described above is one of factors responsible for determining the breakdown voltage of the npn type bipolar transistor 61.

In addition, by additionally forming the impurity region 63 in the upper surface of the impurity region 5, and replacing the anode electrode 8 and the cathode electrode 9 with the aforementioned base electrode 68, collect electrode 69 and emitter electrode 64 in the semiconductor device of each of the second to eighth preferred embodiments as well, as in the eleventh preferred embodiment, the inventions according to the respective embodiments can be applied to a semiconductor device including the npn type bipolar transistor 61.

Moreover, in this semiconductor device in which the base electrode 68 of the npn type bipolar transistor 61 may be applied with overvoltage depending on the usage condition, the base electrode 68 may become higher in potential than the collector electrode 69, which renders the impurity region 5 higher in potential than the impurity region 6. Accordingly, conductivity modulation may occur in the semiconductor layer 2 between the impurity regions 5 and 6 in this semiconductor device as well. In view of this, by additionally forming the impurity region 63 in the upper surface of the impurity region 5, and replacing the anode electrode 8 and the cathode electrode 9 with the aforementioned base electrode 68, collector electrode 69 and emitter electrode 64 in the semiconductor device of the ninth preferred embodiment as well, as in the eleventh preferred embodiment, the operation of the parasitic bipolar is prevented in a semiconductor device including the npn type bipolar transistor 61.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate of p type;
   a semiconductor layer of n type provided on said semiconductor substrate;
   a first buried impurity region of n type provided at an interface between said semiconductor substrate and said semiconductor layer;
   a second buried impurity region of p type provided at an interface between said semiconductor layer and said first buried impurity region;
   a first impurity region of n type provided in an upper surface of said semiconductor layer above said second buried impurity region; and
   a second impurity region of p type provided apart from said first impurity region in said upper surface of said semiconductor layer above said first buried impurity region so as to surround said first impurity region in a perspective view from said upper surface toward said semiconductor substrate therebelow,
   wherein, upon applying a higher potential to said first impurity region than to said second impurity region, said second impurity region and said second buried impurity region are electrically isolated from each other by a depletion layer, and said first impurity region and said first buried impurity region are electrically isolated from each other by a depletion layer.

2. The semiconductor device according to claim 1, wherein the end of said second buried impurity region extends past said second impurity region to the side opposite to said first impurity region.

3. The semiconductor device according to claim 1, wherein said semiconductor layer exists between said second impurity region and said second buried impurity region.

4. The semiconductor device according to claim 3, further comprising a third impurity region of p type formed adjacently to said second impurity region in said upper surface of said semiconductor layer, said third impurity region having a lower impurity concentration than said second impurity region.

5. The semiconductor device according to claim 1, wherein said second buried impurity region does not exist directly under said second impurity region.

6. The semiconductor device according to claim 1, wherein said second impurity region is formed in said upper surface of said semiconductor layer above said second buried impurity region,
   said semiconductor device further comprising:
   a third impurity region of n type provided apart from said second impurity region in said upper surface of said semiconductor layer, on the side opposite to said first impurity region with reference to said second impurity region; and
   a fourth impurity region of p type provided apart from said second impurity region in said upper surface of said semiconductor layer between said second and third impurity regions, said fourth impurity region reaching said second buried impurity region,
   said third and fourth impurity regions being electrically connected to each other, and floating in potential.

7. The semiconductor device according to claim 6, wherein said semiconductor layer exists between said second impurity region and said second buried impurity region.

8. The semiconductor device according to claim 1, further comprising:
   a third buried impurity region of p type provided at said interface between said semiconductor layer and said first buried impurity region, on the side opposite to said first impurity region with reference to said second impurity region;
   a third impurity region of n type provided apart from said second impurity region in said upper surface of said semiconductor layer, on the side opposite to said first impurity region with reference to said second impurity region; and
   a fourth impurity region of p type provided apart from said second impurity region in said upper surface of said semiconductor layer between said second and third impurity regions, said fourth impurity region reaching said third buried impurity region, wherein
   said second buried impurity region does not exist directly under said second impurity region, and
   said third and fourth impurity regions are electrically connected to each other, and floating in potential.

9. The semiconductor device according to claim 6, further comprising a fifth impurity region of n type provided apart from said second impurity region in said upper surface of said semiconductor layer between said second and fourth impurity regions, wherein
   said third to fifth impurity regions are electrically connected to each other, and floating in potential.

10. The semiconductor device according to claim 8, further comprising a fifth impurity region of n type provided apart from said second impurity region in said upper surface of said semiconductor layer between said second and fourth impurity regions, wherein
    said third to fifth impurity regions are electrically connected to each other, and floating in potential.

11. The semiconductor device according to claim 1, wherein a cathode electrode and an anode electrode are provided on said first and second impurity regions respectively.

12. The semiconductor device according to claim 1, further comprising:
    a third impurity region of n type provided in an upper surface of said second impurity region;
    a gate electrode provided above said second impurity region between said third impurity region and said semiconductor layer;
    a drain electrode provided on said first impurity region; and
    a source electrode provided on said second and third impurity regions.

13. The semiconductor device according to claim 1, further comprising;
    a third impurity region of n type provided in an upper surface of said second impurity region;
    an emitter electrode provided on said third impurity region;
    a collector electrode provided on said first impurity region; and
    a base electrode provided on said second impurity region.

14. The semiconductor device according to claim 1, wherein said second impurity region provided in said upper surface of said semiconductor layer is formed to extend into said second buried impurity region such that an edge of said second impurity region forms a contact portion with an edge of said second buried impurity region.

15. The semiconductor substrate according to claim 14, wherein upon applying the higher potential to said first impurity region than to said second impurity region, said depletion layer electrically isolating said second impurity region and said second buried impurity region is configured to deplete said contact portion of said edges of said second impurity region and said second buried impurity region.

16. The semiconductor device according to claim 1, wherein said first buried impurity region is provided completely below said upper surface of said semiconductor layer at said interface between said semiconductor substrate and said semiconductor layer.

17. The semiconductor device according to claim 1, wherein a lateral length of said first buried impurity region is greater than a lateral length of said second buried impurity region.

18. The semiconductor device according to claim 1, wherein said semiconductor layer extends continuously between an outer edge of said first impurity region provided in said semiconductor layer and an outer edge of said second impurity region provided in said semiconductor layer.

19. The semiconductor device according to claim 1, wherein said first impurity region is provided in said upper surface of said semiconductor layer apart from said first buried impurity region.

* * * * *